(12) United States Patent
Stengel et al.

(10) Patent No.: US 6,556,080 B1
(45) Date of Patent: Apr. 29, 2003

(54) FEEDFORWARD NOTCH FILTER

(75) Inventors: Robert E. Stengel, Pompano Beach, FL (US); Scott A. Olson, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/017,985

(22) Filed: Dec. 13, 2001

(51) Int. Cl.$^7$ ................................................ H03F 1/00
(52) U.S. Cl. ........................................ 330/151; 330/306
(58) Field of Search ................................ 330/151, 149, 330/306, 303, 286; 327/552

(56) References Cited

U.S. PATENT DOCUMENTS

| | | | |
|---|---|---|---|
| 4,447,790 A | * | 5/1984 | Fukuda et al. ............... 330/149 |
| 5,119,040 A | * | 6/1992 | Long et al. .................. 330/149 |
| 5,491,454 A | * | 2/1996 | Matz ........................... 330/149 |
| 5,977,826 A | * | 11/1999 | Behan et al. ................ 330/151 |
| 6,236,272 B1 | * | 5/2001 | Takei et al. ................. 330/286 |
| 6,316,983 B1 | * | 11/2001 | Kitamura .................... 327/317 |
| 6,400,226 B2 | * | 6/2002 | Sato ............................ 330/286 |

* cited by examiner

*Primary Examiner*—Henry Choe
(74) *Attorney, Agent, or Firm*—Barbara R. Doutre

(57) ABSTRACT

A feedforward amplifier and notch filter (150) according to the present invention uses a direct coupling of an amplifier stage (158) with the amplifier's load ($R_L$). The main amplifier (202) is coupled through a transmission line (210) to the load. This direct coupled amplifier stage (158) is driven by an signal that induces a very low impedance in parallel with the load at the receive frequency, but appears as an open circuit at the desired frequencies so that the desired signal from the main amplifier is virtually unaffected while output components at the receive frequency are cancelled.

20 Claims, 7 Drawing Sheets

— PRIOR ART —

FEEDFORWARD NOTCH FILTER

FIELD OF THE INVENTION

This invention relates generally to the field of electronic filters. More particularly, in certain embodiments this invention relates to a feed forward method and apparatus for providing a notch filter in an RF amplifier.

BACKGROUND OF THE INVENTION

Radio transceivers, by definition, have both a transmitter and a receiver—often in the same physical package and using a common power supply, antenna and other circuitry. Due to nonlinearities in the amplification process and leakage signals from the receiver, amplifiers such as radio frequency (RF) power amplifiers can produce undesirable spectral components at the output, often including substantial energy at the receiver's receive frequency. These undesired spectral components can create interference at a receive frequency of the associated receiver (i.e., in a transceiver) and may violate federal regulations. Feed forward compensation has been used in amplifiers to help linearize the amplifiers to compensate for such nonlinearities.

A conventional arrangement of a feedforward amplifier is depicted in FIG. 1 as amplifier 50. The power amplifier 54 in this case amplifies the RF input signal applied to its input to produce an output signal which passes through delay 58. The output of amplifier 54 is also passed through a pad 62 to reduce its magnitude. The input signal is also passed through a delay 66 and is subtracted from the output of the pad 62 to produce an error signal that represents the signal that should be removed from the output of amplifier 54 in order to linearize the amplifier 54's amplification. This error signal is then amplified by error amplifier 72 and subtracted at element 76 from the output signal from delay element 58. The error amplifier provides enough gain so that the amount of signal subtracted at 76 approximately matches the output level of the corresponding frequency content emerging from the delay 58. In this manner, the RF output signal from the feedforward amplifier 50 is linearized and the spurious content of the RF output is reduced substantially.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
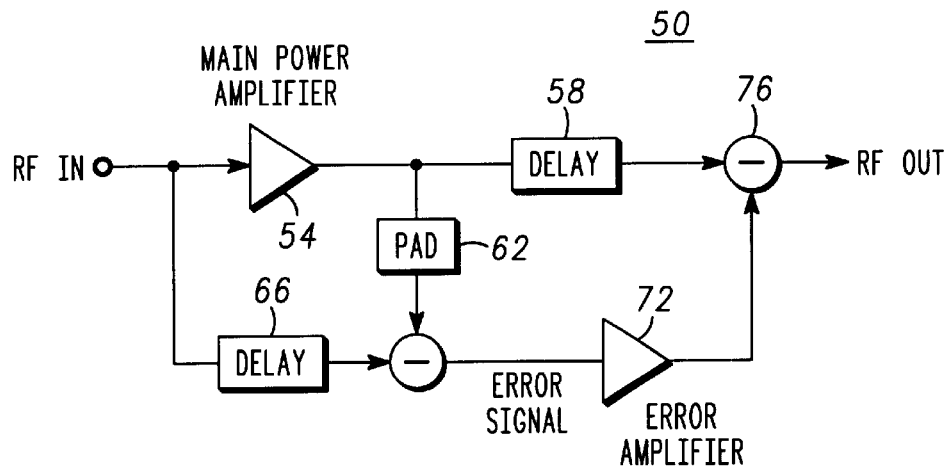
FIG. 1 illustrates a feedforward amplifier structure.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring back to FIG. 1, while the feedforward amplifier 50 works well in theory and in practice, the implementation details make conventional feedforward amplifier systems such as 50 only suitable for limited use. In practice, the subtracting element 76 is normally implemented with a directional coupler to provide a loose coupling to the output of power amplifier 54. A directional coupler is used for the coupling mechanism because it provides a desired level of isolation between the main power amplifier 54, antenna (load) and the error amplifier 72. Unfortunately, this isolation comes at a price of a high level of attenuation of the output of the error amplifier 72—often ten to twenty decibels of attenuation. This suggests that the error amplifier 72 itself requires a substantial amount of gain and power output capacity.

In order to be useful in cancellation of the spurious signal components from amplifier 54, error amplifier 72 should operate in a very linear fashion (e.g., a class A power amplifier). In practice, the error amplifier 72 may be a power amplifier of approximately the same size and power generation capability as the power amplifier 54. These constraints suggest that the feedforward power amplification system 50 is not a power efficient system. The physical size required to implement such an amplifier generally makes it impractical to realize in a small package such as would be required for a hand-held portable communication device. The lack of energy efficiency further suggests that the utility of such a feedforward amplifier 50 is limited and generally not well suited for use in a battery-powered device. The delays 58 and 66 are used to carefully match the delay and phase shift characteristics of the main signal path and the error signal path and may require substantial care in selection or tuning.

Figure 2:
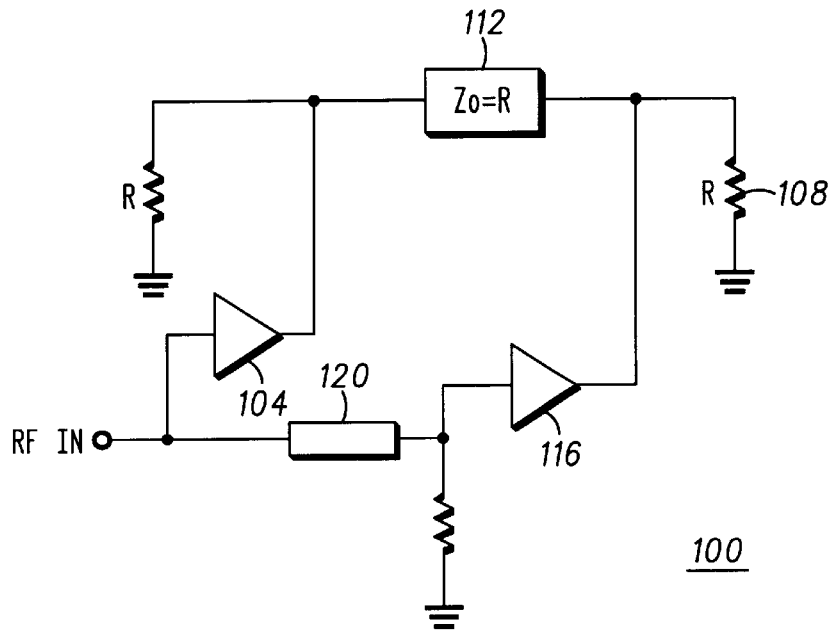
FIG. 2 is a block diagram of a two stage distributed amplifier.

By observing that a feedforward amplifier as illustrated in FIG. 1 resembles a two stage distributed amplifier, as illustrated in FIG. 2, an improvement in feedforward amplifier design incorporating a notch filtering function at the receive frequency can be developed. The simple distributed amplifier 100 of FIG. 2 has a first stage amplifier 104 driving a load resistance 108 through a transmission line 112. The input to a second stage amplifier 116 is delayed by a transmission line 120 and further contributes to driving the output load 108 by a direct coupling.

One substantial difference between the two types of amplifiers 50 and 100 is that the feedforward amplifier 50 uses a directional coupler 76 to provide isolation in the signal combining process, while the distributed amplifier 100 uses tightly coupled signal combining. In a distributed amplifier such as 100, the signals being combined are currents which are of differing amplitude but identical or similar phase. This results in a virtual impedance presented to each source which can used in designing a system which operates in a power efficient manner. If the impedance of the output network decreases at each node as the output is approached, the individual sources can be made to source similar amounts of current, operate into similar impedances, and not dump large portions of their output into a dummy load (as is the case in a conventional distributed amplifier).

The last stage in a distributed amplifier (such as amplifier 116 of distributed amplifier 100) may potentially be used to provide a notch filter function useful in reducing the output of the main amplifier in the spectral region of the receive frequency. The injection of a suitable error signal at the output can be used to cause a time varying virtual impedance seen by the previous stages, but since the signal is often at least 50 dB less than the intended signal, any effect on the impedances at the desired output signal will be small.

Figure 3:
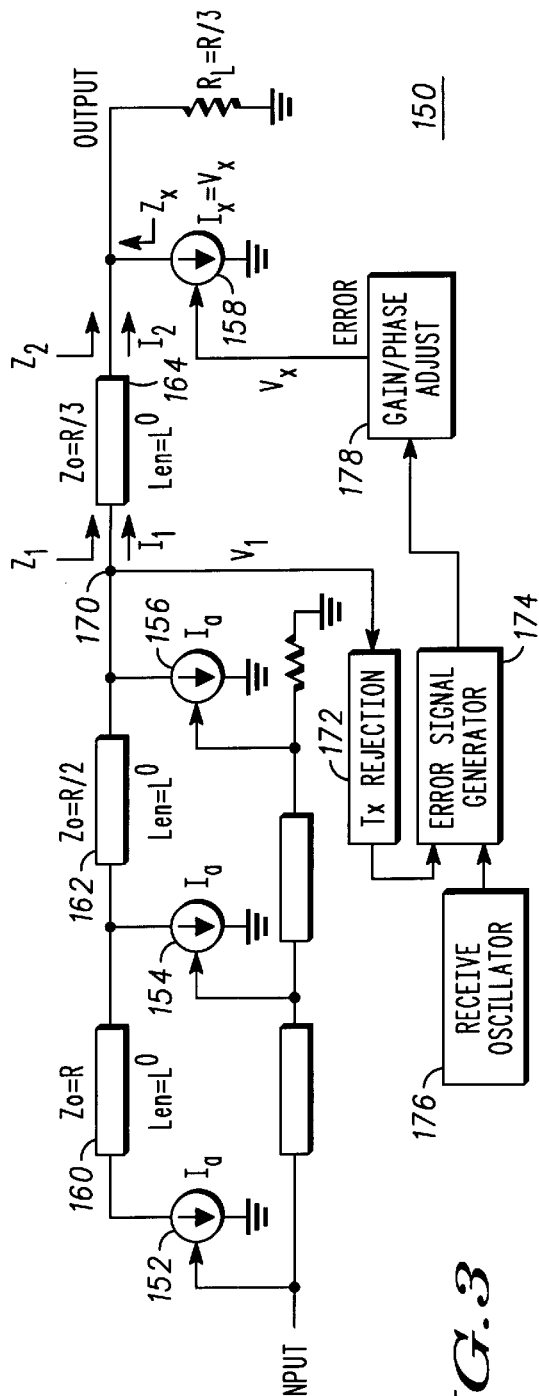
FIG. 3 is an equivalent circuit representation of a three stage distributed feedforward amplifier arrangement with a notch filter consistent with certain embodiments of the present invention.

FIG. 3 is a simplified block diagram of a three stage distributed amplifier with a fourth stage added for cancellation of energy at the receive frequency shown generally as 150. In this illustration, transistors or amplifiers are represented as controlled current sources 150, 152, 154 and 156. The four amplifier stages are separated by transmission lines 160, 162 and 164 of length L degrees with progressively decreasing characteristic impedances (R, R/2 and R/3). The output of the main distributed amplifier is taken at node 170 and passed through a filter 172 which rejects signals at the transmitter's desired output frequency. The filtered output of 172 is applied to an error signal generator 174 that generates a signal at the receive frequency as an output reference signal. In one embodiment, this is accomplished by mixing the filtered output of 172 down to baseband by mixing the output of 172 with an oscillator signal from the receive oscillator 176. Once at baseband, the signal can be processed using baseband signal processing and then mixed back up to RF by again mixing with the receive oscillator signal to produce the reference signal. The reference signal, after phase and gain adjustment at 178 is used as an error signal to drive the amplifier stage 158.

If the output of the main distributed amplifier at node 170 (voltage $V_1$, or current $I_1$ operating into load $Z_1$) were distortionless without any receive frequency components, then the error signal would be zero, error current source $I_x$ would be zero, and the system would function as a three stage distributed amplifier. Any non-zero error, and hence non-zero error correction current $I_x$, may result in a departure from the nominal impedance presented to the main amplifier.

A feedforward amplifier and notch filter (150) according to certain embodiments of the present invention uses a direct coupling of an amplifier stage (158) with the amplifier's load ($R_L$). The main amplifier (202) is coupled through a transmission line (210) to the load. This direct coupled amplifier stage (158) is driven by a signal that induces a very low impedance in parallel with the load to the receive frequency, but appears as an open circuit at the desired frequencies so that the desired signal from the main amplifier is substantially unaffected.

Thus, a feedforward amplifier system with a notch filter consistent with certain embodiments of the present invention has a main amplifier that drives a load at a transmitter frequency through a transmission line. An output signal from the main amplifier is sampled and an error signal at a receive frequency is produced therefrom. An error processor adjusts amplitude and phase of the error signal and directly couples the processed error signal into the load. The processed error signal produces an impedance at the load approximating a short circuit to the error signal.

Figure 4:
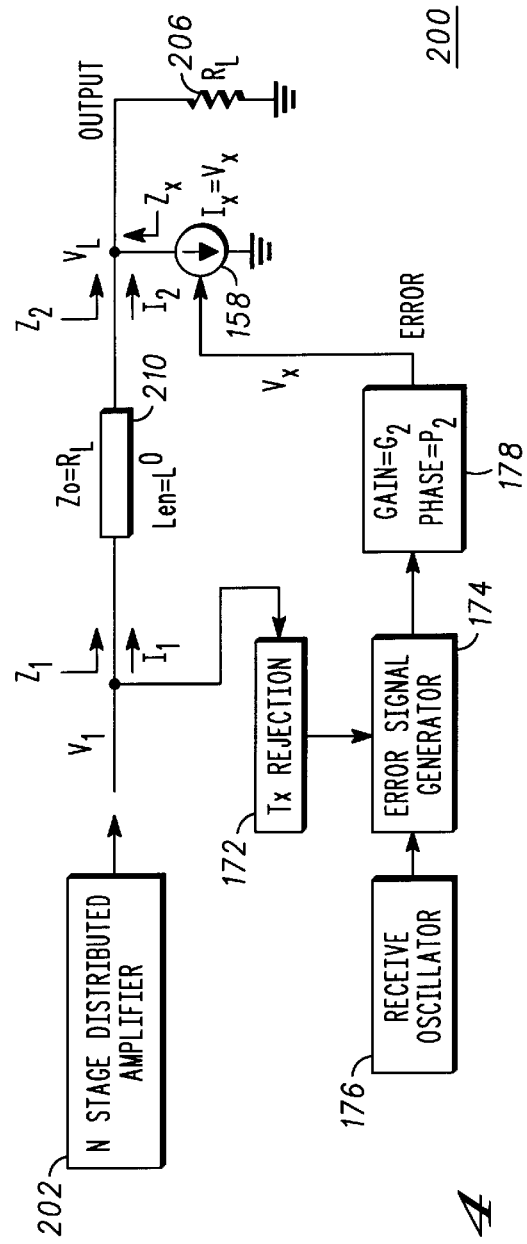
FIG. 4 is an equivalent circuit representation of an N stage distributed feedforward amplifier arrangement with a notch filter consistent with certain embodiments of the present invention.

To investigate the effect of a tightly coupled feedforward error signal, refer to the partial feedforward amplifier with notch filter block diagram shown as 200 in FIG. 4. The output of the main distributed amplifier 202 is designed to function as a current source operating into a resistive load 206 with value $R_L$. Assume that the output of the main amplifier 202 is such that after filtering at 172 the signal contains spectral components outside of the intended signal's bandwidth including signals at the receive frequency. This implies that the error signal contains only distortion products and none of the intended signal (it may take a predistorted input to the main amplifier to achieve this). This is exactly what is conceptualized in a first order description of a feedforward amplifier. Applying superposition consider the currents $I_1$ and $I_2$ entering and leaving transmission line 210 respectively) to be composed of desired and error signals ($I_1=I_{1d}+I_{1e}$, $I_2=I_{2d}+I_{2e}$). Since the error signal has no frequency components in common with the desired signal, error source $I_x$ of amplifier 158 will not effect the impedance seen by the $I_{1d}$ and $I_{2d}$. If it is desired for the system to remove all of the error, $I_x$ will sink all of the error current $I_{2e}$ and therefore will appear as a short circuit to the error signal. Theoretically, one could therefore achieve perfect error cancellation with no effect on the intended signal in the distributed amplifier.

Still referring to FIG. 4, assume an N stage distributed amplifier followed by a single stage of feed forward correction. Current $I_1$ is the output of the N stage amplifier, which has been designed to operate into a resistive load $R_L$, and therefore the characteristic impedance of the output transmission line is also $R_L$. Let the electrical length of the output transmission line be L degrees. The reference signal ($V_R$) amplitude and phase ($G_1$ and $P_1$) are adjusted so that the error signal $V_c$ contains only distortion components (i.e., spectral components at the receive frequency). As previously explained, this results in there being no effect on the desired signal. Let the phase adjustment of the error signal ($P_2$) be 90 degrees. Let the gain adjustment of the error signal be $G_2$. One can now determine the relationship between $I_1$, $R_L$, L and $P_2$ which will result in perfect cancellation of the error signal.

Figure 5A:
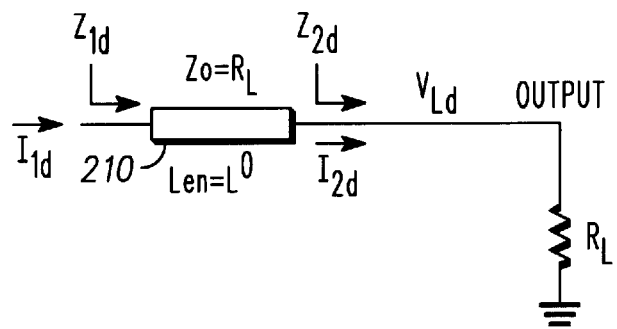
FIGS. 5A and 5B are equivalent circuits of the load as it appears to the main amplifier with regard to the desired output signal in FIG. 5A and with regard to the error signal in FIG. 5B.
Figure 5B:
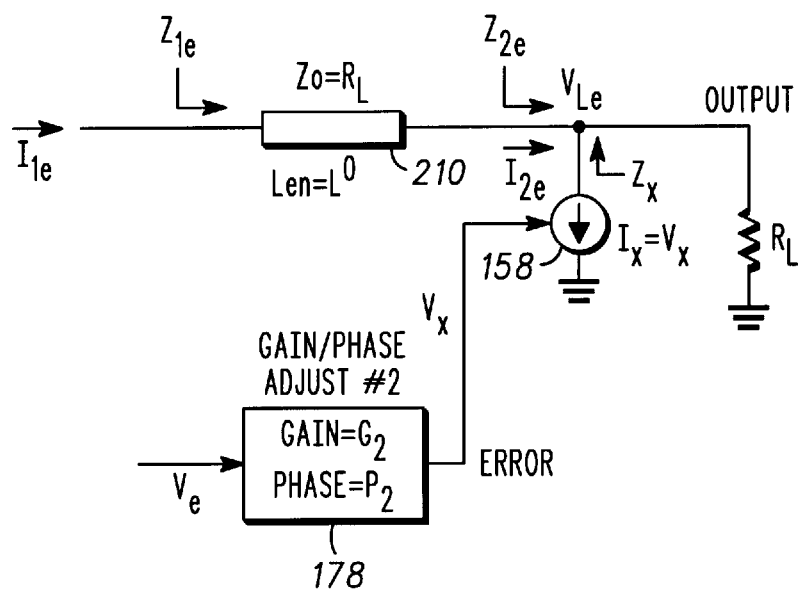

It may be helpful to redraw FIG. 4 to represent the circuits as seen by the desired and error signals. This is shown in FIG. 5, which is made up of FIG. 5A representing the desired signal and FIG. 5B representing the error signal. The current, voltage and impedance designations have an added "d" or "e" suffix to indicate desired or error signal. Now consider the conditions necessary for the error signal to achieve perfect cancellation at the load in FIG. 5B. For perfect cancellation $V_{Le}=0$ and is independent of the value of the load $R_L$.

Assuming a lossless transmission line with output voltage and current $V_2$ and $I_2$ respectively, the input voltage $V_1$ is given by:

$$V_1 = V_2 \cos L + jI_2 Z_0 \sin L \quad \{\text{eqn. 1}\}$$

where L is the electrical length and $Z_0$ is the characteristic impedance of the transmission line. Since $V_{Le}=0$, $Z_0=R_L$, $V_1=V_e$, and $I_2=I_{2e}$, Equation 1 reduces to:

$$V_e = jI_{2e} R_L \sin L \quad \{\text{eqn. 2}\}$$

Since no error current flows into the load, the error sink $I_x=I_{2e}$. $I_x$ is a function of the input voltage $V_e$. If $P_2$ is chosen to be 90 degrees, and $G_2$ is unknown:

$$V_x = V_e(-j)G_2 \quad \{\text{eqn. 3}\}$$

Since $I_{2e}=I_x=V_x$ $$I_{2e} = V_e(-j)G_2 \quad \{\text{eqn. 4}\}$$

or $$G_2 = \frac{jI_{2e}}{V_e} \quad \{\text{eqn. 5}\}$$

Substituting Equation 2 into Equation 5:

$$G_2 = \frac{1}{R_L \sin L} \quad \{\text{eqn. 6}\}$$

Figure 6:
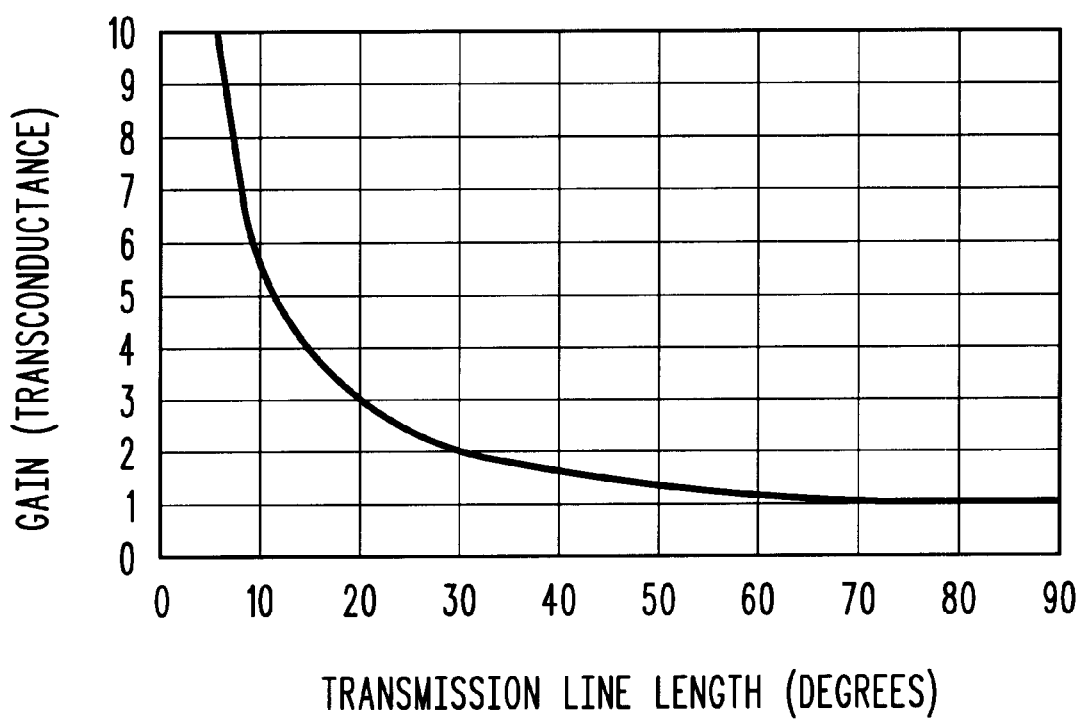
FIG. 6 is a graph of transconductance verses length of transmission line 210 of FIG. 5.

As the length of the transmission line (L) approaches 90 degrees, $G_2$ approaches $1/R_L$. As the length of the transmission line approaches 0, $G_2$ grows very large. This is illustrated in FIG. 6 which shows $G_2$ as a function of the transmission line length normalized to an impedance $R_L=1$.

From the above, it can be deduced that the current $I_x$ from 158 can be controlled by the output of Gain and Phase adjustment circuit 178 in such a manner that the output of the main amplifier (e.g., 202) sees an impedance $Z_{ld}$ (the impedance at the desired output signal) which is virtually unaffected by the presence of the amplifier 158's direct connection to the load. Preferably, the load is well matched to the main amplifier 202 so that the impedance at the desired signal is a purely resistive matched impedance. However, at the frequency or frequencies of the error signals, the current $I_x$ from 158 can be controlled by the output of Gain and Phase adjustment circuit 178 in such a manner that the output of the main amplifier (e.g., 202) sees an impedance $Z_{le}$ that is transformed to a very small impedance $Z_{2e}$ compared to the load impedance $R_L$. The impedance $Z_{2e}$ being very small results in the error current being mostly sunk by transistor 158 and the current delivered to the load $R_L$ at the error signal frequencies is greatly reduced.

In general, the transmission line can be any characteristic impedance and length, but practically speaking it is easier to deal with a transmission line between roughly 10 or 20 degrees in length and about 90 degrees in length. The gain and phase characteristics of the error signal can then be adjusted at 178 so that the impedance to the error signal seen at the load ($Z_{2e}$) is minimized.

It has been shown that there is ideally no effect on the desired signal in a feed forward amplifier if the error signal is comprised only of distortion components at the receive frequency. If the error path signal instead contains some desired signal (due to imperfect summing, carrier feedthough, inadequate isolation, etc.) there will be a load modulation (both amplitude and phase) of the desired signal which will effect the operation of the main amplifier.

From the above, it can be concluded that in the ideal case, the output signal can be applied from the output of the main amplifier through a transmission line or lumped element while at the load side of this transmission line, an error signal can be applied directly to the output load to cancel out the error at the receive frequency in the main amplifier output. This is done in a manner such that the current applied by the error amplifier produces a very low impedance (i.e., approximating a short circuit to ground) as seen by the main amplifier at the receive frequency making up the error signal. If this constraint is met or approximated, the transistor used to couple the error signal into the load will sink most of the error current and the error signals will be largely cancelled out at the load without need for the loose coupling through a directional coupler as used in more conventional feedforward linearized amplifier circuits.

Figure 7:
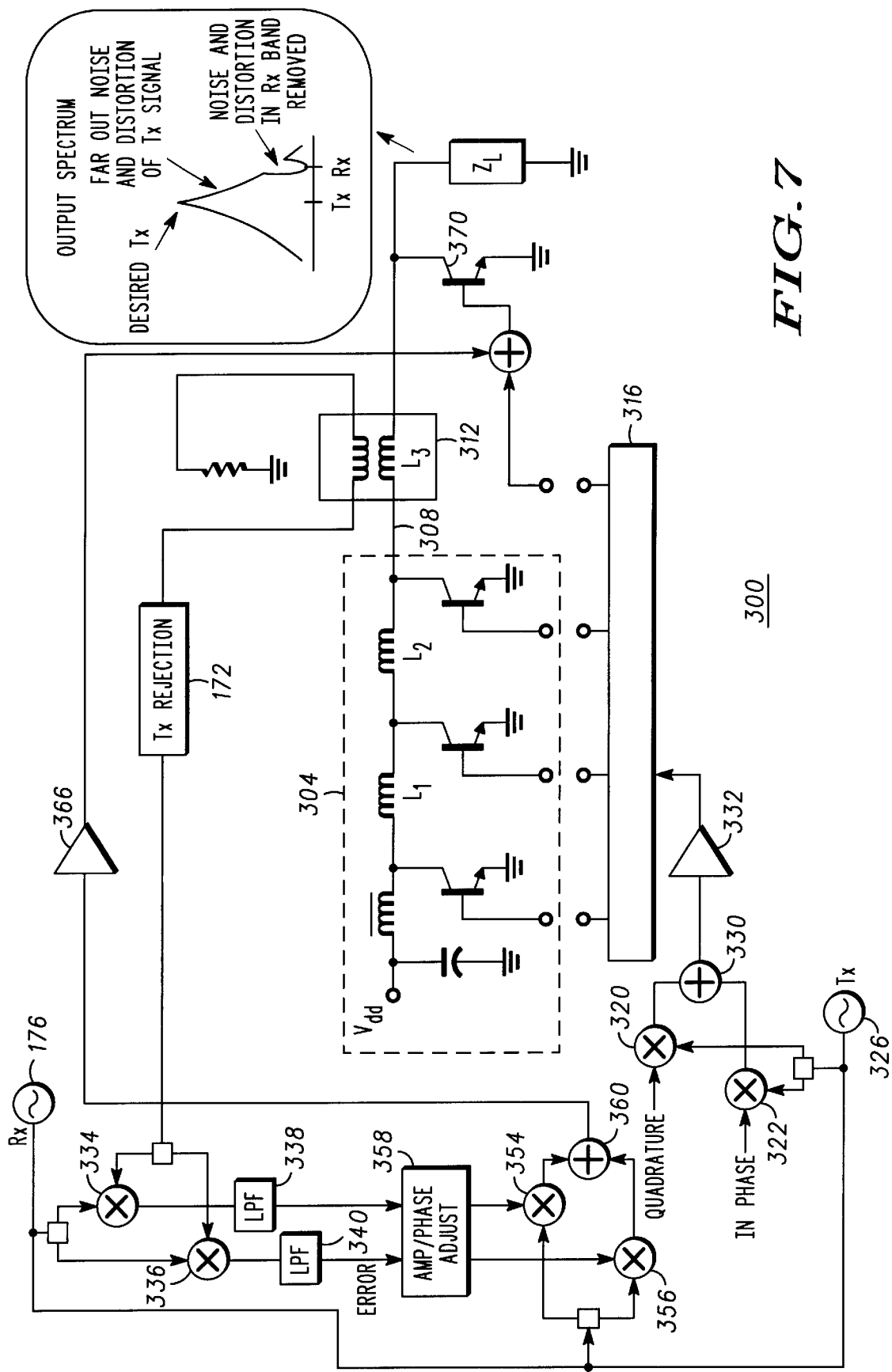
FIG. 7 is a detailed block diagram schematic of a distributed feedforward amplifier with a notch filter consistent with certain embodiments of the present invention.

Thus far, the gain stages in the distributed amplifier have been shown as ideal gain blocks or ideal current sources, and the delay elements have been shown as ideal transmission lines. In reality, the gain stages are composed of transistors, and the delay elements are generally synthetic transmission lines which exploit the parasitic input and output capacitances of the active devices. A more realistic feedforward distributed amplifier schematic is shown in FIG. 7. In this embodiment, a three stage distributed amplifier 304 produces an output signal at node 308. This output signal is sampled using a directional coupler 312 and passed along to the load $Z_L$. The distributed amplifier 304 is driven by a drive signal synthesizer 316 (which may be as simple as a chain of transmission lines or may utilize digital or analog signal processing to produce the drive signals). The drive signals from 316 are derived, in this embodiment, from the baseband in-phase and quadrature input signals (which may be preconditioned) which are mixed at mixers 320 and 322 with a signal from a transmitter oscillator 326 to produce RF in-phase and quadrature signals. These RF signals are summed together at 330 and amplified at 332 to drive the drive signal synthesizer 316.

The signal derived from the directional coupler 312 is filtered at a filter 172 to reject the desired transmitter frequency components and then provided to a pair of mixers 334 and 336 which mix down the RF error signal to baseband by mixing the signals with an output of the receive oscillator 176. These baseband signals are the low pass filtered at 338 and 340 to eliminate nonlinear mixing components and, if desired, other spurious content from the sampled output signal. The gain and phase are then adjusted at 358 (again at baseband to provide for simplified processing functions). The adjusted in-phase and quadrature signals from 358 are then modulated back to RF by mixers 354 and 356 which mix the outputs of 338 and 340 with the signal from the receive oscillator 176. The outputs of mixers 354 and 356 could alternately be amplitude and phase adjusted at this point if desired. The up-mixed in phase and quadrature signals are then summed together at 360 and amplified at 366. This error signal at the output of 366 is then applied to the input of a stage of amplification (in this case a bipolar transistor 370) that is directly coupled to the load on the opposite side of directional coupler 312 as the distributed amplifier 304. In this embodiment, the primary side of the directional coupler 312 is connects the last stage of the distributed amplifier 304 with the load and serves as a transmission line that separates the error signal from the output of the distributed amplifier 304.

Feedforward amplifier and notch filter 300 of FIG. 7 advantageously utilizes a mixing arrangement that takes the sampled output signal less the desired transmitter frequency down to baseband. This permits the reference signal to be subtracted and any other manipulation such as adjustment of phase and amplitude to be handled using baseband signal processing, e.g., using a programmed processor as the low pass filters 338 and 340. This adjusted signal can then be mixed back up to radio frequencies for cancellation of the receive frequencies in the output to the load. However, the mix-down to baseband and mixing to RF should not be considered limiting, since in other embodiments, the reference signal (which may be taken from the input chain to the main amplifier) can be directly removed from the sampled output signal without the mix-down process, without departing from the invention.

Figure 8:
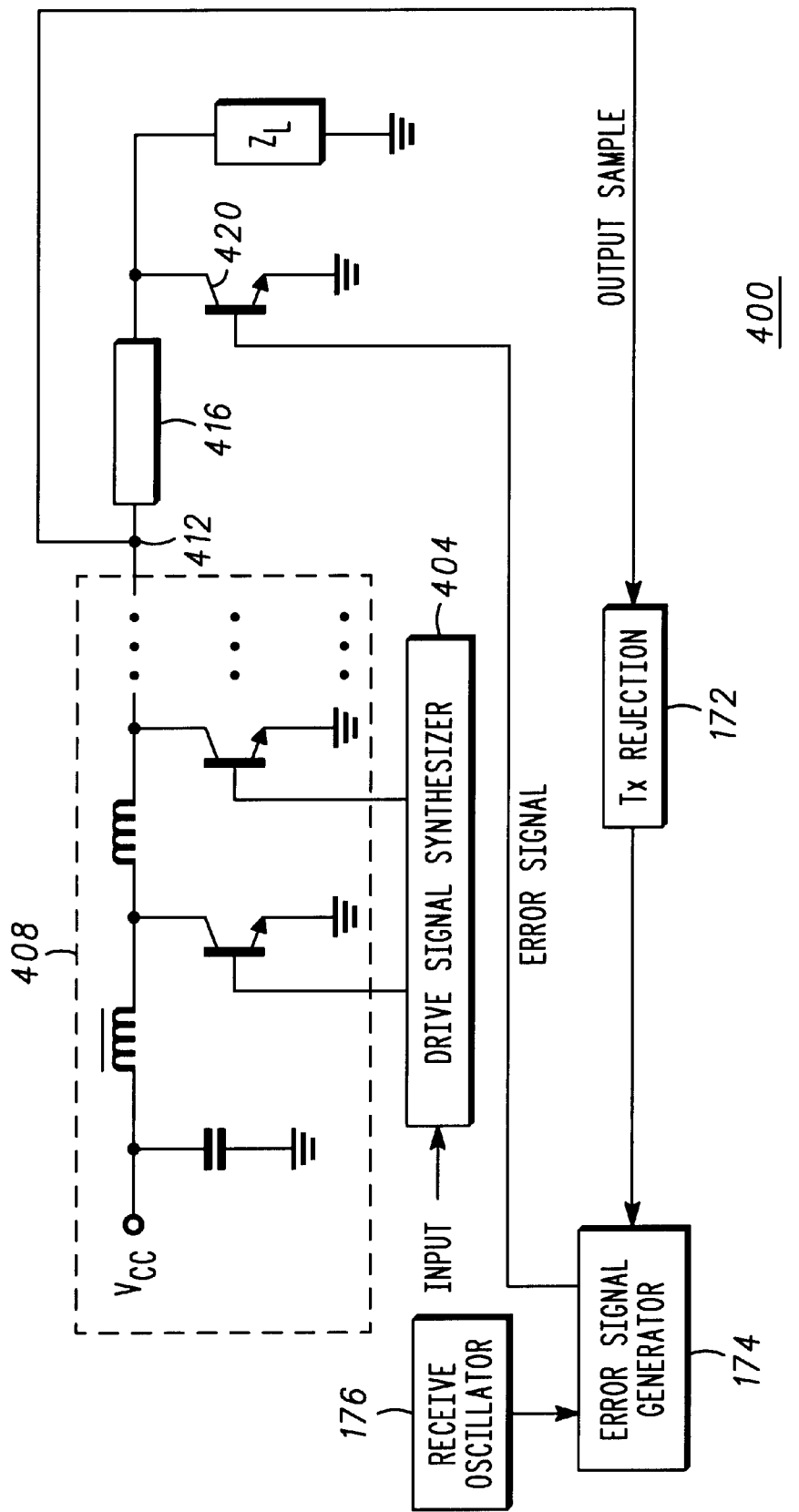
FIG. 8 is a high level block diagram of a distributed feedforward amplifier arrangement with a notch filter consistent with certain embodiments of the present invention.

The distributed feedforward amplifier and notch filter 300 of FIG. 7 can be more broadly depicted as the distributed feedforward amplifier 400 of FIG. 8. In this amplifier, a drive signal synthesizer 404 receives an input signal and drives one or more stages of a distributed amplifier structure 408. This produces an output signal at node 412 that drives the load $Z_L$ through transmission line 416. This transmission line 416 may be either a coaxial, planar, stripline, or other form of actual transmission line, or may be a lumped element approximation of a strip line, without limitation.

At the load side of the transmission line 416, an amplifier, transistor, etc. such as 420 is directly connected to provide the tight coupling described herein. The transistor 420 is driven by an error signal generator 174 that receives an output sample, for example taken at node 412 by a loose electrical coupling (e.g., a directional coupler, a pad, a buffer or a large impedance value lumped element such as a very small value capacitor) after filtering by a transmitter frequency rejection filter 172. This filtered output sample contains both the spurious and distortion components that includes the receiver frequency spectrum output being produced by the main amplifier 408. The error signal generator 174 produces an error signal at the receive frequency that drives transistor 420. As described above, the error signal driving transistor 420 is provided in appropriate phase and amplitude so that the error components emerging from the output of amplifier 408 are largely cancelled at the load.

Figure 9:
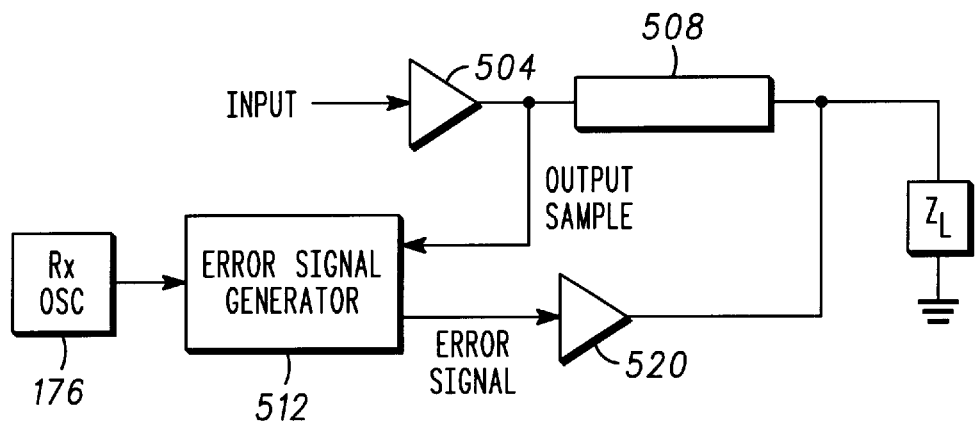
FIG. 9 is a high level block diagram of a feedforward amplifier arrangement with a notch filter consistent with certain embodiments of the present invention.

Although the discussion to this point has centered around embodiments of the present invention that are implemented using a distributed amplifier structure, this should not be considered limiting. In the general case, the main amplifier can be of conventional structure without departing from the invention. This is illustrated in general as feedforward amplifier 500 in FIG. 9, where a main amplifier 504 is coupled through a transmission line 508 to a load $Z_L$. As previously described, transmission line 416 may be either a coaxial, planar, stripline, or other form of actual transmission line, or may be a lumped element approximation of a strip line, without limitation.

An output sample is taken at the output of amplifier 504 using, for example, a loose electrical coupling (e.g., a directional coupler, a pad, a buffer or a large impedance value lumped element such as a very small value capacitor). This output sample contains both the desired output signal and the spurious and distortion components that make up the error signal. The error signal generator 512 takes this output sample and produces the error signal containing components of the receive oscillator 176 to drive an error amplifier 520. As described above, the error signal driving amplifier 520 is provided in appropriate phase and amplitude so that the error components at the receive frequency emerging from the output of amplifier 504 are largely cancelled at the load $Z_L$.

Figure 10:
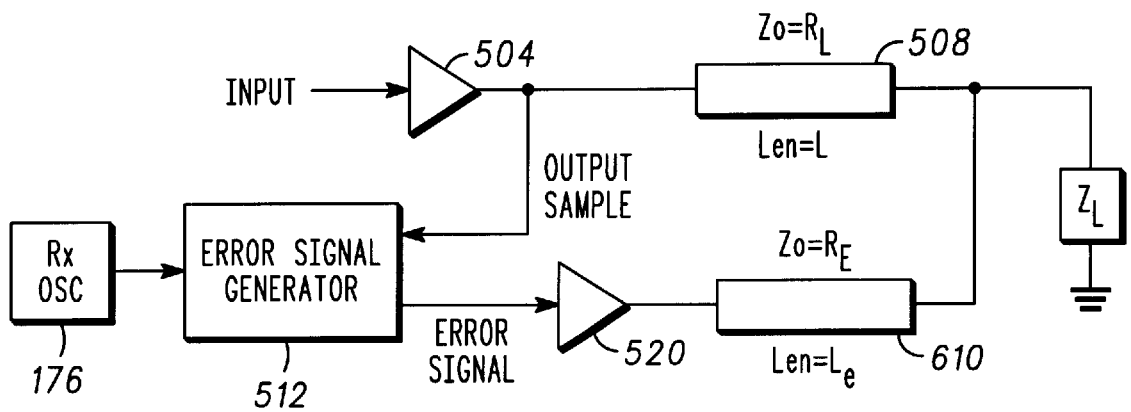
FIG. 10 is another high level block diagram of a feedforward amplifier arrangement with a notch filter consistent with certain embodiments of the present invention.

The present invention has thus far been described wherein the error signal amplifier is in the form of a current source tightly coupled to the load. Those skilled in the art will understand alternate means of inducing the required error current. FIG. 10 depicts one such embodiment 600 wherein the error signal amplifier 520 operates as a voltage source. The transmission line 610 then acts as a voltage to current transformer to induce the required error current at the load to produce a virtual short circuit in parallel with $R_L$ at the receive frequency. Whereas the gain of the current source error amplifier was shown to be a function of the output load impedance and length of the output transmission line as described in Equation 6, the gain of a voltage source error amplifier is also a function of the characteristic impedance and length of the transmission line 610 as described by:

$$G_2 = \frac{-R_E \sin L_E}{R_L \sin L} \quad \{\text{eqn. 7}\}$$

where $R_E$ is the characteristic impedance of the error signal transmission line 610, and $L_E$ is the length of the transmission line.

Those skilled in the art will understand that the distributed amplifiers depicted herein are depicted as using bipolar transistors. However, distributed amplifiers are commonly implemented using other types of transistors including field effect transistors, gallium arsenide devices, etc. Such variations are equivalent and within the scope of the present invention.

Those skilled in the art will also recognize that the present invention may be implemented using a programmed processor to implement the error signal generation or by using hardware component equivalents such as special purpose hardware and/or dedicated processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention. The programmed processor of embodiments herein execute programming instructions that are broadly described above which can be stored on any suitable electronic storage medium or transmitted over any suitable electronic communication medium.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A feedforward amplifier system with notch filter, comprising:

a main amplifier that drives a load at a transmitter frequency through a transmission line;

means for sampling an output signal from the main amplifier and for deriving an error signal at a receive frequency therefrom;

an error processor that adjusts amplitude and phase of the error signal and directly couples the processed error signal into the load;

wherein the processed error signal produces an impedance at the load approximating a short circuit at the receive frequency; and wherein the sampling and deriving means comprises a directional coupler having a primary transmission line and a secondary transmission line, and wherein the primary transmission line couples the main amplifier to the load and forms the transmission line, and wherein the error signal is derived from a signal induced on the secondary transmission line.

2. The apparatus according to claim 1, wherein the main amplifier comprises a distributed amplifier.

3. The apparatus according to claim 1, wherein the transmission line comprises a lumped element approximation to a transmission line.

4. The apparatus according to claim 1 wherein the deriving means further comprises a filter that removes components at the transmitter frequency from the sampled output signal.

5. The apparatus according to claim 1, wherein the sampling and deriving means further comprises a first mixer that mixes the sampled output signal with a receive oscillator signal to produce a baseband sampled signal; and further comprises a low pass filter that filters the baseband sampled signal to produce a baseband error signal; and further comprises a mixer that mixes the baseband error signal with the receive oscillator signal to produce the error signal.

6. The apparatus according to claim 1, wherein the main amplifier amplifies a combined in-phase and a quadrature input signal.

7. The apparatus according to claim 6, wherein the sampling and deriving means further comprises a first pair of mixers that mix the sampled output signal with a receive oscillator signal to produce in-phase and quadrature baseband sampled signals; and further comprises a pair of low-pass filters that filter the in-phase and quadrature baseband sampled signals to produce a pair of filtered baseband error signals; and further comprises a pair of mixers that mix the pair of baseband error signals with the receive oscillator signal to produce in-phase and quadrature error signals; and further comprising a combiner that combines the in-phase and quadrature error signals to produce the error signal.

8. The apparatus according to claim 1, wherein the transmission line has length between approximately 10 and 90 degrees.

9. A feedforward amplifier system that drives a load at a transmitter frequency, comprising:
   a main amplifier;
   a transmission line coupling the main amplifier to the load;
   a loosely coupled sampler that samples an output signal from the main amplifier to produce a sampled output;
   a filter that filters components of the transmitter frequency from the sampled output to produce a filtered sampled output;
   an error signal generator that generates an error signal having components at a receive frequency from the sampled output; and
   an error processor that adjusts amplitude and phase of the error signal and directly couples the processed error signal into the load;
   wherein the processed error signal causes produces an impedance at the load approximating a short circuit at the receive frequency.

10. The apparatus according to claim 9, wherein the sampler comprises a directional coupler having a primary transmission line and a secondary transmission line, and wherein the primary transmission line couples the main amplifier to the load and forms the transmission line, and wherein the error signal is derived from a signal induced on the secondary transmission line.

11. The apparatus according to claim 9, wherein the transmission line comprises a lumped element approximation to a transmission line.

12. The apparatus according to claim 9, wherein the error signal generator comprises:
   a first mixer that mixes the filtered sampled output signal with an oscillator signal to produce a baseband sampled signal;
   a low pass filter that filters the baseband sampled signal to produce a baseband error signal; and
   a mixer that mixes the baseband error signal with the receive oscillator signal to produce the error signal.

13. The apparatus according to claim 9, wherein the main amplifier amplifies a combined in-phase and a quadrature input signal.

14. The apparatus according to claim 13, wherein the error signal generator comprises:
   a first pair of mixers that mix the sampled output signal with a receive oscillator signal to produce in-phase and quadrature baseband sampled signals;
   a pair of low-pass filters that filter the in-phase and quadrature baseband sampled signals to produce a pair of filtered baseband error signals;
   a pair of mixers that mix the pair of baseband error signals with the receive oscillator signal to produce in-phase and quadrature error signals; and
   a combiner that combines the in-phase and quadrature error signals to produce the error signal.

15. The apparatus according to claim 9, wherein the main amplifier comprises a distributed amplifier.

16. The apparatus according to claim 9, wherein the transmission line is approximately 10 to 90 degrees in length.

17. A feedforward amplifier system that drives a load at a transmitter frequency, comprising:
   a main amplifier;
   a directional coupler having a primary transmission line and a secondary transmission line, and wherein the primary transmission line couples the main amplifier to the load, and wherein the secondary transmission line samples an output signal from the main amplifier to produce a sampled output;
   a filter that filters components of the transmitter frequency from the sampled output to produce a filtered sampled output;
   an error signal generator that generates an error signal having components at a receive frequency from the sampled output;
   the error signal generator comprising:
     a first mixer that mixes the filtered sampled output signal with an oscillator signal to produce a baseband sampled signal;
     a low pass filter that filters the baseband sampled signal to produce a baseband error signal; and
     a mixer that mixes the baseband error signal with the receive oscillator signal to produce the error signal; and
   an error processor that adjusts amplitude and phase of the error signal and directly couples the processed error signal into the load;
   wherein the processed error signal causes produces an impedance at the load approximating a short circuit at the receive frequency.

18. The apparatus according to claim 17, wherein the main amplifier comprises a distributed amplifier.

19. A feedforward amplifier system that drives a load at a transmitter frequency, comprising:
   a main amplifier that amplifies a combined in-phase and a quadrature input signal;

a directional coupler having a primary transmission line and a secondary transmission line, and wherein the primary transmission line couples the main amplifier to the load, and wherein the secondary transmission line samples an output signal from the main amplifier to produce a sampled output;

a filter that filters components of the transmitter frequency from the sampled output to produce a filtered sampled output;

an error signal generator that generates an error signal having components at a receive frequency from the sampled output;

the error signal generator comprising:
  the error signal generator comprises:
    a first pair of mixers that mix the sampled output signal with a receive oscillator signal to produce in-phase and quadrature baseband sampled signals;

a pair of low-pass filters that filter the in-phase and quadrature baseband sampled signals to produce a pair of filtered baseband error signals;

a pair of mixers that mix the pair of baseband error signals with the receive oscillator signal to produce in-phase and quadrature error signals; and a combiner that combines the in-phase and quadrature error signals to produce the error signal; and an error processor that adjusts amplitude and phase of the error signal and directly couples the processed error signal into the load;

wherein the processed error signal causes produces an impedance at the load approximating a short circuit at the receive frequency.

20. The apparatus according to claim 19, wherein the main amplifier comprises a distributed amplifier.

\* \* \* \* \*